United States Patent [19]

Takatsu et al.

[11] Patent Number: 5,700,326
[45] Date of Patent: Dec. 23, 1997

[54] MICROWAVE PLASMA PROCESSING APPARATUS

[75] Inventors: Kazumasa Takatsu, Yokohama; Takashi Kurokawa, Kawasaki; Hiroshi Echizen, Nagahama; Akio Koganei, Ichikawa; Shuichiro Sugiyama, Nagahama; Toshio Adachi, Inagi, all of Japan

[73] Assignee: Canon Kabushiki Kaisha, Tokyo, Japan

[21] Appl. No.: 395,191

[22] Filed: Feb. 27, 1995

Related U.S. Application Data

[63] Continuation of Ser. No. 21,859, Feb. 24, 1993, abandoned.

[30] Foreign Application Priority Data

Feb. 27, 1992 [JP] Japan .................................. 4-41472

[51] Int. Cl.$^6$ ................................................. C23C 16/00
[52] U.S. Cl. .................... 118/723 MW; 118/723 ME; 118/723 MA
[58] Field of Search .................. 118/723 MP, 723 ME, 118/723 MW, 723 MA, 723 AN, 218; 150/345; 204/298.38, 298.24

[56] References Cited

U.S. PATENT DOCUMENTS

| | | | |
|---|---|---|---|
| 4,951,602 | 8/1990 | Kanai | 118/719 |
| 5,010,276 | 4/1991 | Echizen et al. | 315/111.21 |
| 5,030,476 | 7/1991 | Okamura et al. | 118/723 X |
| 5,074,985 | 12/1991 | Tamura et al. | 204/298.11 |
| 5,188,862 | 2/1993 | Itatani et al. | 427/570 |
| 5,266,146 | 11/1993 | Ohno | 156/345 |
| 5,270,616 | 12/1993 | Itatani | 315/111.21 |
| 5,276,386 | 1/1994 | Watanabe | 315/111.21 |

FOREIGN PATENT DOCUMENTS

| | | | |
|---|---|---|---|
| 63-60530 | 3/1988 | Japan . | |
| 02-209485 | 8/1990 | Japan | 118/723 MR |
| 03-111577 | 5/1991 | Japan . | |
| 3-110798 | 5/1991 | Japan . | |
| 03-191069 | 8/1991 | Japan | 118/723 MR |
| 03-191074 | 8/1991 | Japan | 118/723 MP |

OTHER PUBLICATIONS

Japanese abstract JA 0298106, Hiroyki Uchida, Dec. 1987.
Patent abstract SU 0863716 Mosc Aviat Tech Ins, Sep. 1981.

*Primary Examiner*—Jey Tsai
*Assistant Examiner*—Joni Y. Chang
*Attorney, Agent, or Firm*—Fitzpatrick, Cella Harper & Scinto

[57] ABSTRACT

A microwave plasma processing apparatus comprises a vacuum processing chamber, a substrate disposed within the vacuum processing chamber, a microwave guide coupled to the vacuum processing chamber, and fins for dividing a microwave in the electric field direction. The length of fins are different such that the uniformity of the film thickness distribution on the substrate of large area can be improved.

18 Claims, 9 Drawing Sheets

MICROWAVE PLASMA PROCESSING APPARATUS

This application is a continuation of application Ser. No. 08/021,859 filed Feb. 24, 1993, now abandoned.

BACKGROUND OF THE INVENTION

1. Field of the Invention

The present invention relates to a plasma processing apparatus using a microwave plasma, and more particularly to a microwave plasma processing apparatus for stably generating a plasma over a large area for a long time by supplying a microwave power to the plasma.

2. Related Background Art

Recently, problems of environmental contamination have assumed a serious aspect. A method for generating electric power by a solar battery system making use of a solar light does not cause any environmental contamination associated therewith such as global warming in case of thermal-power generation or a radioactive contamination in case of atomic-power generation. Further, the solar battery power generation has such advantages as: the presence of the energy source is easily available since the solar light is pouring to almost all over the earth; and a relatively high power generating efficiency can be attained without needing a complicated and large-sized installation. Thus, the solar battery power generation is attracting public attention as a clean power generating method capable of meeting the increasing electric power demand in the future without causing destruction of earth., and is now under fluorishing research and development for practical use.

To realize a power generation by solar battery capable of sufficiently meeting the actual power demand, the solar battery to be used must have a significantly high photoelectric conversion efficiency and an excellent stability of properties and be able to be mass-produced.

For example, a solar battery having an output of approximately 3 kW for each family is required to meet total power demands of the family. If the photoelectric conversion efficiency of the solar battery is e.g. approximately 10%, the area of the solar battery for achieving the necessary output would be approximately 30 m². Accordingly, for supplying necessary power to meet the demand from e.g., 100,000 families, a giant solar battery with an area of 3,000,000 m² must be provided.

Under such a consideration, the most likely solar battery for mass-production with low cost uses a silane as a material gas being easily available. The material gas is decomposed by e.g. glow discharge to accumulate non-single crystal semiconductor thin films on a relatively inexpensive substrate made of glass or metallic sheet etc. This type of solar battery is advantageous over that made by using a single-crystal silicon etc. in cost, so there have been proposed various producing methods and apparatuses. One kind of such apparatus is a microwave plasma processing apparatus, which is capable of increasing the energy density to be higher than the conventional case of using high-frequency such as radio frequency, thereby efficiently generating and maintaining the plasma, so as to be suitable for forming a semiconductor film in the solar battery etc.

However, in the conventional microwave plasma processing apparatus, such problems as destruction of a microwave introductory window by adhesion of the film thereto etc. have arisen. To reduce the possibility of film adhesion to the microwave introductory window and the window destruction, a plurality of fins are provided in the direction orthogonal to the electric field direction of the microwave as disclosed in Japanese Patent Laid-Open No. 3-110798. Alternatively, to overcome such problems, Japanese Patent Laid-Open No. 3-122273 discloses a film forming apparatus using a microwave which comprises a dielectric component for maintaining a pressure of a film forming chamber at a predetermined value. In this reference, adhesion of the film forming material to the dielectric component can be prevented by providing an intercepting member, without impeding the transmission of the microwave.

The microwave introductory window is exchanged by setting the inside of the vacuum processing chamber to an atmospheric pressure. Therefore, when the chamber is used again its inside must be set again to the vacuum state, and heating and introduction of an inactive gas thereinto are required to eliminate impurities such as gases and moisture in the atmosphere, thereby taking a significantly long time for the preparation of the plasma processing. Thus, it is preferable for reduce the number of times to exchange the microwave introductory window for enhancing the productivity.

However, according to the above-mentioned conventional microwave plasma film forming chamber, the surface of the microwave introductory window for introducing the microwave and the surface of the substrate on which the film is formed are parallel to each other. As a result, when the film forming process continues for a long time, the film forming particles (also referred to as "dust" hereinafter) which have not accumulated on the substrate would easily adhere on the window surface.

Further, when a semiconductor etc. is formed continuously for a long time by the plasma processing, the amount of the film forming particles which have not accumulated on the substrate would be great. As a result, if the film-forming substrate and the microwave introductory window are parallel to each other, it would become impossible to prevent the undesirable adhesion of the particles to the window.

The inventor of the present application has studied the microwave plasma processing apparatus shown in FIG. 4 for comparison. In the above-mentioned plasma processing apparatus, a group of members to divide the microwave in the electric field direction (hereinafter referred to as "fin") are disposed with respect to the position of the substrate 2 for film forming as shown in FIG. 4, it becomes impossible to obtain a uniform film thickness over the substrate 2.

Further, particularly when the substrate is too large for the microwave introductory window, the film thickness and the film quality would seriously suffer from unevenness.

Moreover, approximately 90% of the microwave energy is used to form the plasma for forming an accumulated film on the substrate surface. The remaining 10% of the microwave which was not used to form the plasma would sometimes undesirably etch the accumulated film, which causes the film quality of the accumulated film to be decreased due to unevenness.

SUMMARY OF THE INVENTION

It is therefore an object of the present invention to provide a plasma processing apparatus which is capable of: reducing the dust etc. adhered to the microwave introductory window after long time use; distributing the film with a uniform thickness irrespective of the distance from the microwave introductory window and eliminating the uneven film thickness distribution; and eliminating the unevenness of the formed film quality caused by the microwave etching.

According to the present invention, a microwave plasma processing apparatus comprising: a vacuum processing chamber; a substrate disposed within said vacuum processing chamber; a microwave guide coupled to said vacuum processing chamber for supplying microwave power thereto; and at least one member disposed near a microwave introductory portion of said vacuum processing chamber for dividing a microwave in the direction of an electric field; wherein said member and a surface of said substrate to be plasma-processed are not orthogonal to each other.

The member may have a fin-like shape.

In another aspect of the present invention, there are at least two of said members, the lengths of which are set such that the one closer to said substrate, is longer.

In another aspect of the present invention, a distal ends of said members are set to have an unequal interval from said substrate.

In another aspect of the present invention, the substrate is a continuously movable band-like member.

The above and other advantages, features and additional objects of the present invention will be manifest to those versed in the art upon making reference to the following detailed description and the accompanying drawings in which a structural embodiment incorporating the principles of this invention is shown by way of illustrative example.

DETAILED DESCRIPTION OF THE PREFERRED EMBODIMENTS

A plasma processing apparatus according to the present invention will now be described with reference to the accompanying drawings.

First Embodiment

Figure 1:
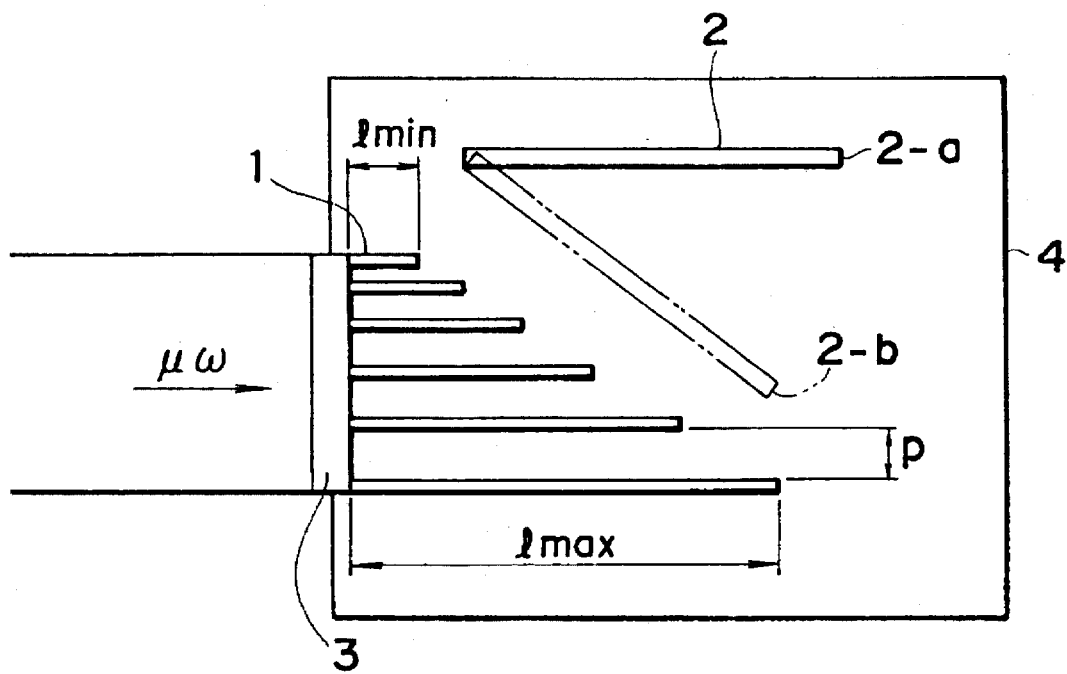
FIG. 1 is a cross-sectional view showing an embodiment of a microwave plasma processing apparatus according to the present invention.
Figure 2:
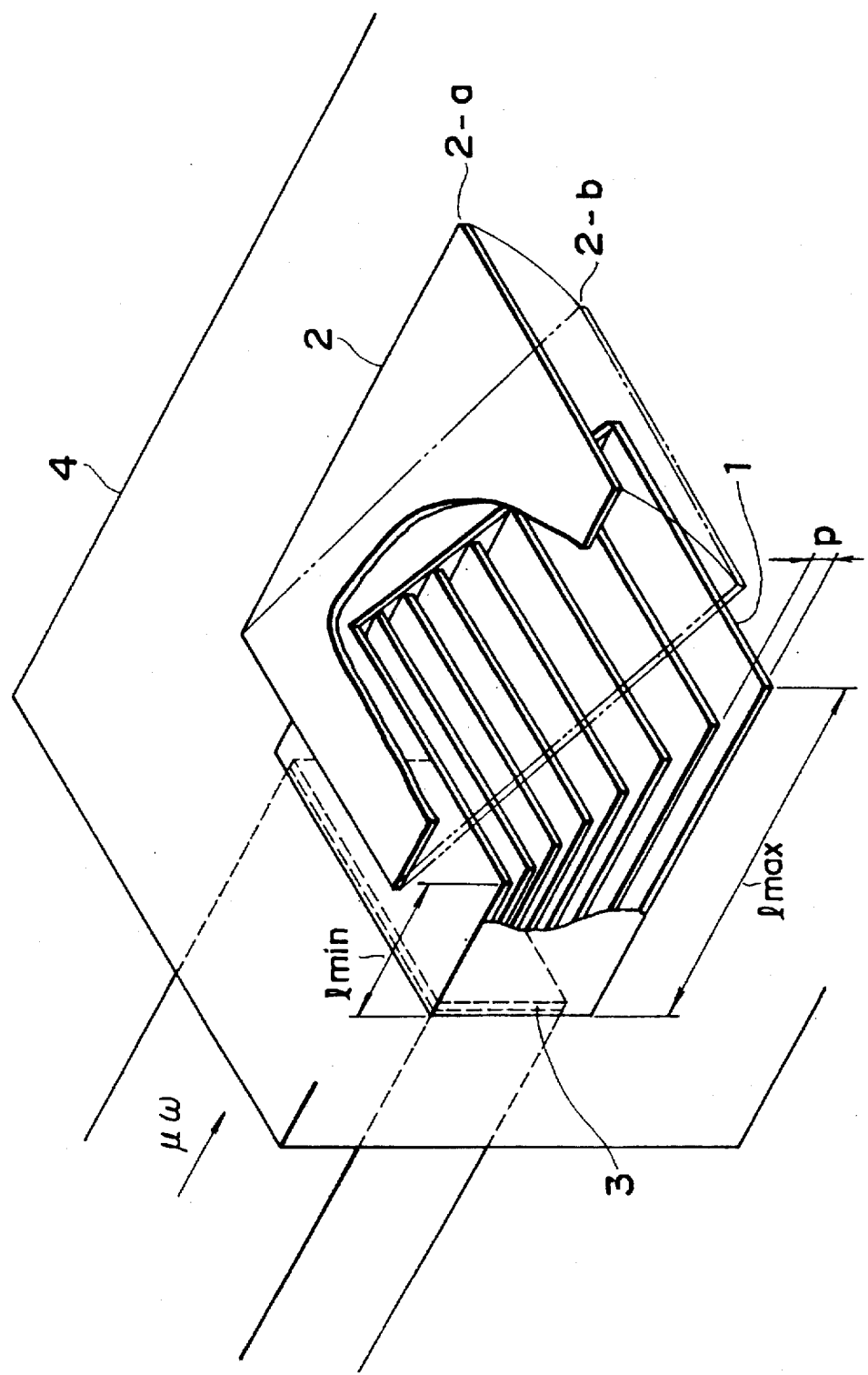
FIG. 2 is a schematic view showing a fin and a substrate surface located within a vacuum chamber in the present invention.

FIG. 1 is a schematic cross-sectional view of the film forming apparatus using a microwave processing apparatus according to the first embodiment of the present invention. In FIG. 1, connected to a vacuum chamber 4 are a vacuum exhaust device, a gas introductory tube and a microwave introductory device which are not shown. Within the vacuum chamber 4, there are provided a substrate 2 and fins 1 made of stainless-steel having different lengths for dividing the introduced microwave in the electric field direction and coupled to a microwave introductory window 3 which is in communication with a microwave guide.

For forming a film on the substrate 2 using above-mentioned apparatus, the vacuum chamber 4 is firstly vacuumed by a vacuum exhaust system provided on the vacuum chamber 4. A material gas is then introduced therein and the pressure is maintained approximately at 0.7 Pa. Thereafter, the microwave is introduced into the chamber 4 through the microwave introductory window 3 to generate plasma at the ends of the fins. An amorphous silicon (hereinafter referred to as "a-Si") type film has been formed on a glass (coning 7059) of 500 mm each side by the apparatus shown in FIG. 1.

The conditions were as follows: the flow amount of $SiH_4$=300 SCCM; pressure 0.7 Pa; power of applied microwave=500 W; a film forming time=2 minutes; fin pitch=6.5 mm; number of fins=18; shape and disposition of fins=unequal lengths with 1 min=20 mm and 1 max=450 mm and the length of fins located therebetween being increasing sequentially with an equal unit.

The a-Si film formed with the above-mentioned conditions has a relatively uniform film thickness. Further, even in case of continuous film forming, problem due to the dust etc. hardly arose at the microwave introductory window.

Comparative Example

Figure 4:
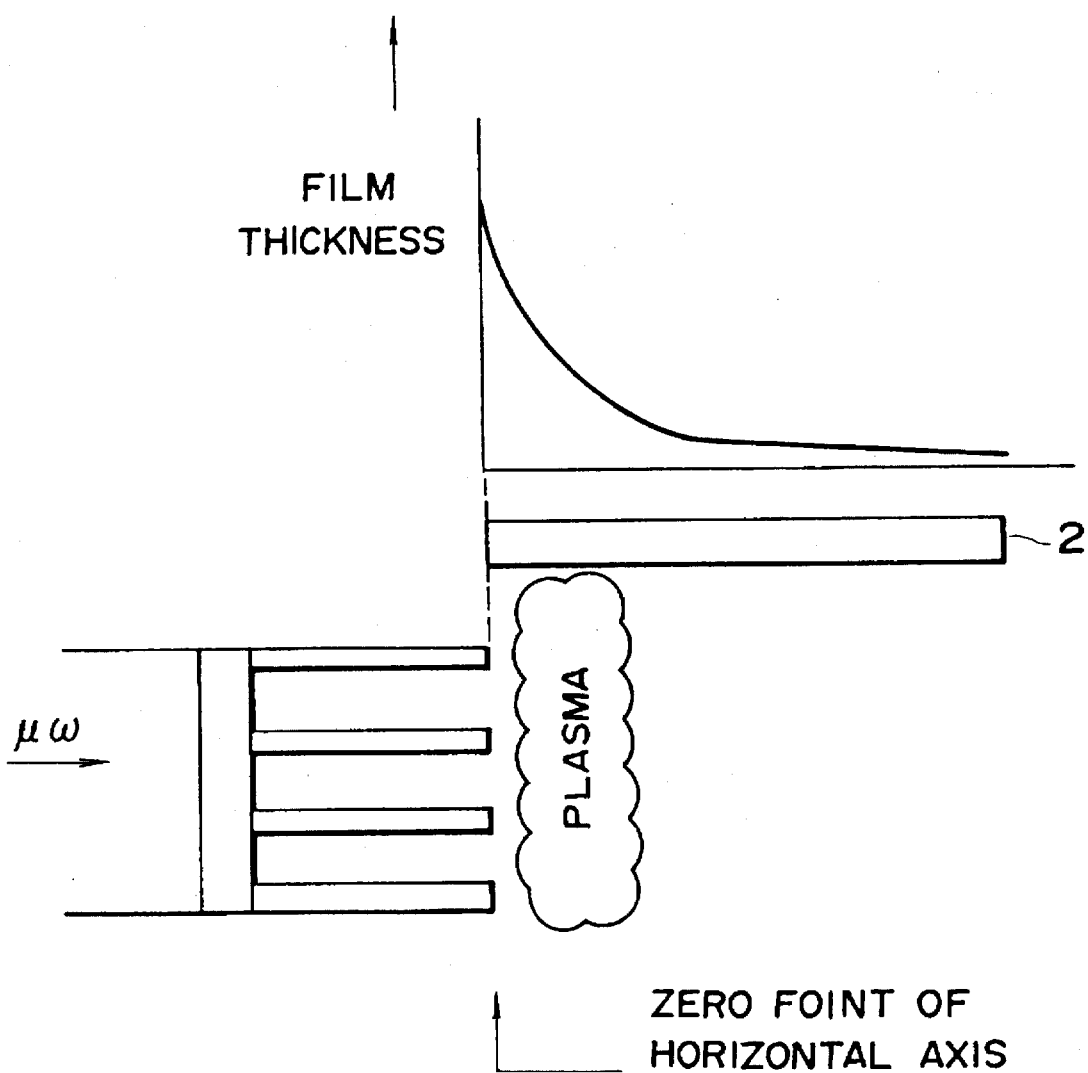
FIG. 4 is a schematic view showing a cross-sectional view of plasma generation and a formed film thickness in the plasma processing apparatus of the present invention.
Figure 5:
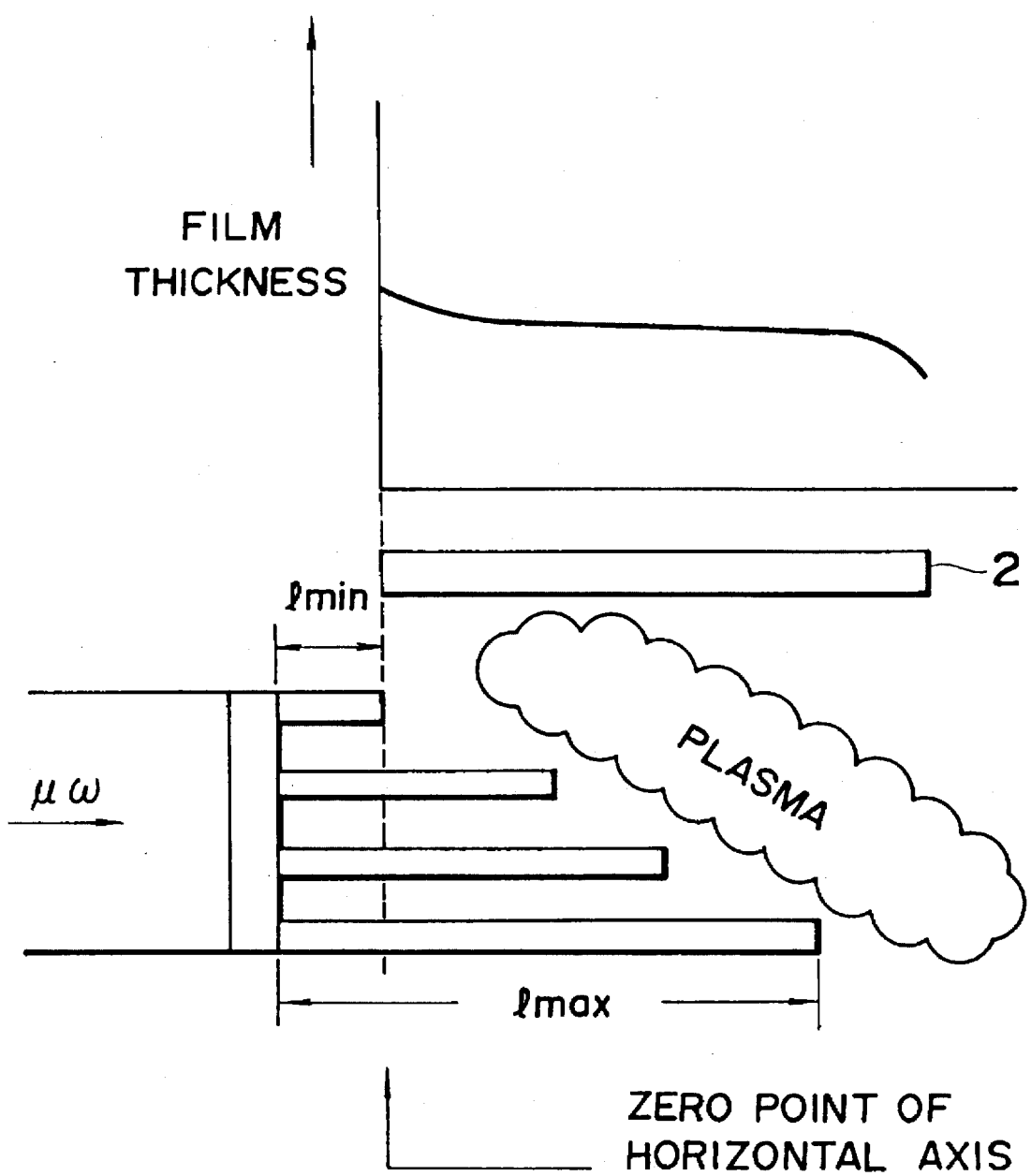
FIG. 5 is a schematic cross-sectional view of the plasma generation and a formed film thickness in the plasma processing apparatus according to the first embodiment of the present invention.

As shown in FIG. 4, the conditions for forming a-Si film have been set equal to those in the first embodiment except that the all fins of 1 min=1 max are of the same length as shown in FIG. 4.

Figure 3:
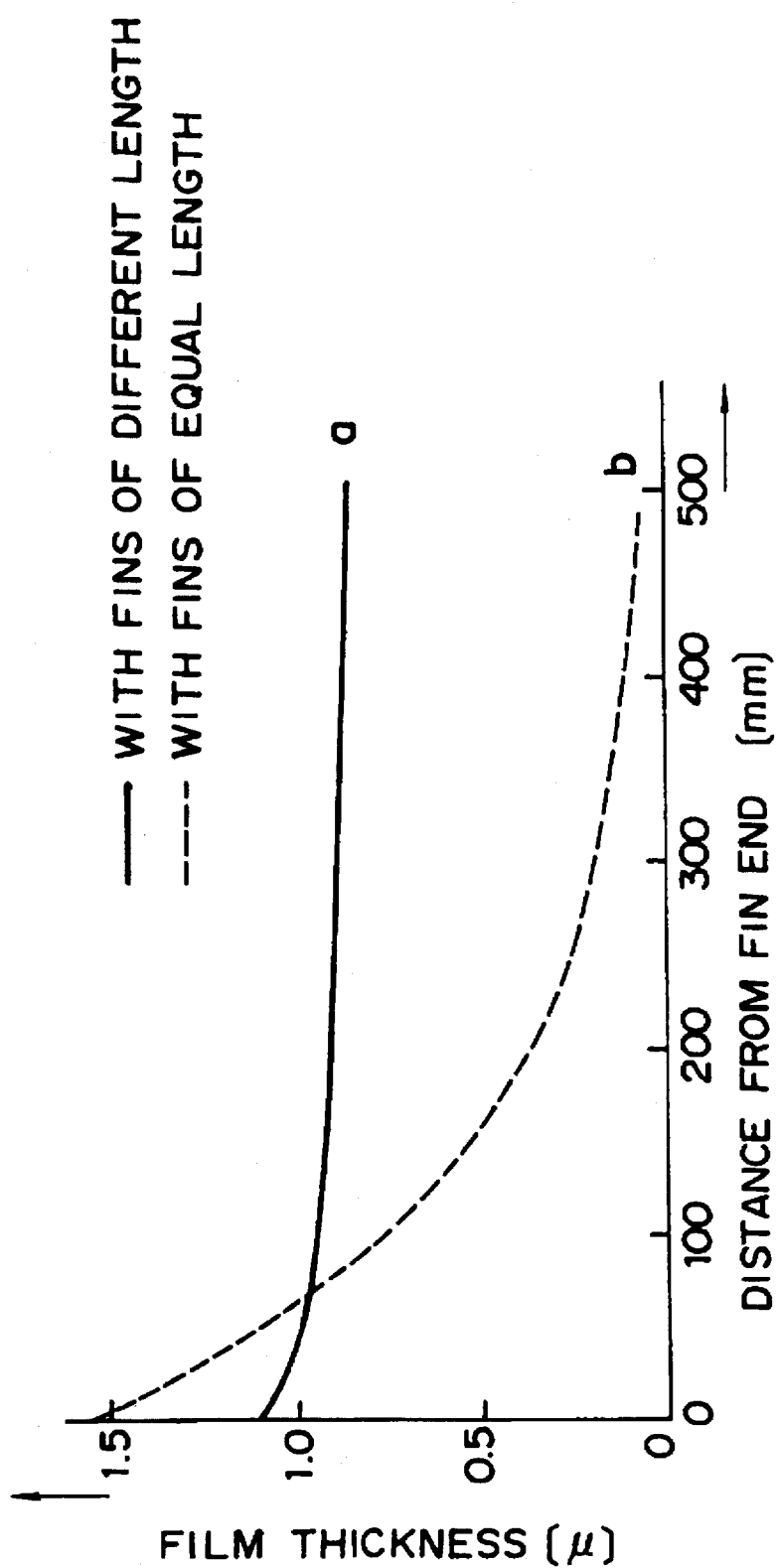
FIG. 3 is a comparative view showing thicknesses of accumulated films when a plasma processing apparatus with equal lengths of the fins and a plasma processing apparatus with different lengths of the fins.

FIG. 3 is a graphic diagram showing the film thickness distributions in the thickness direction of the a-Si films formed on the substrate using the plasma processing apparatus in the comparative embodiment 1 with the same fin lengths and the plasma processing apparatus of the first embodiment with the different fin lengths. The vertical axis represents the film thickness while the horizontal axis represents the distance (mm) from the end of the fins.

It can be seen from FIG. 3 that the film thickness distribution in case of different length (a) is more uniform than in case of the same length (b) due to the expansion of the plasma over the substrate of 500 mm each side. On the contrary, in case of the same fin length, since the plasma density near the fin end is high, the film thickness distribution is poor. Therefore, it is understood that the uniformity of the film thickness distribution on the substrate of large area can be improved by providing fins of different lengths.

Second Embodiment

Figure 6:
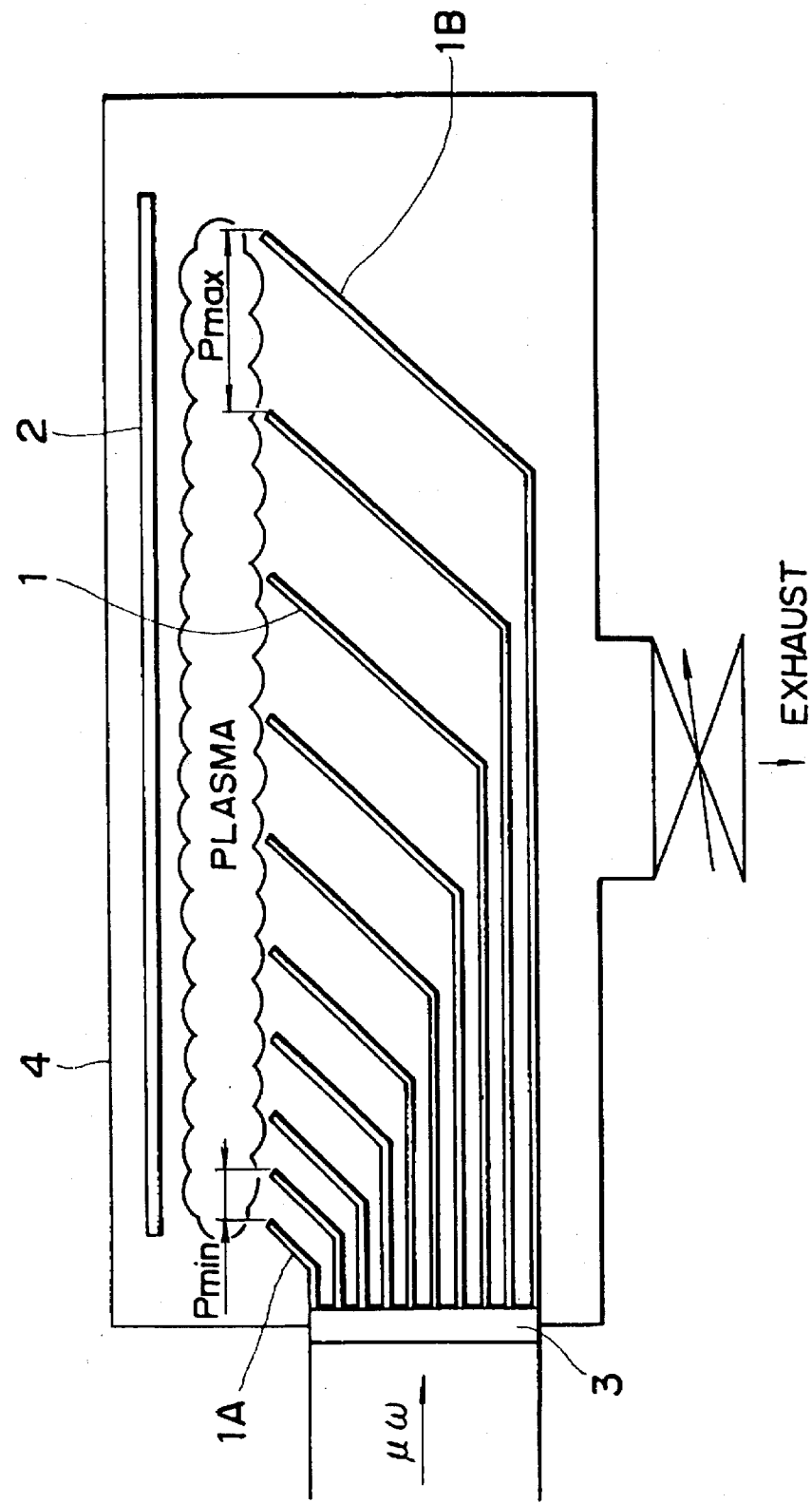
FIG. 6 is a schematic cross-sectional view of a plasma processing apparatus according to another embodiment of the present invention.

FIG. 6 is a schematic cross-sectional view of a plasma processing apparatus according to the second embodiment of the present invention, in which the ends of the fins are disposed with unequal intervals with respect to the substrate 2. The minimum space between the fin 1A closest to the microwave introductory window 3 and a fin contiguous to the fin 1A is designated by Pmin, while the maximum space between the fin 1B most remote from the microwave introductory window 3 and a fin contiguous to the fin 1B is designated by Pmax. The intermediate fins are disposed with a sequentially increasing mutual space from the left-hand side to the right-hand side of the drawing.

Specifically, the ends of the fins are closed to the plasma processing surface in parallel, with mutual space thereof being sequentially expanded so as to set the conditions as: number of fins=18; Pmin=6.5 mm; and Pmax=57.5 mm.

For forming film using Si-Ge etc., in general, the fin shape of FIG. 6 is more suitable than that of FIG. 1. Since the decomposing-speed of Ge is higher than that of Si, the plasma density of Ge at the fin end, so as to vary the film thickness distribution depending on the distance from the fin end to the substrate surface.

Figure 7:
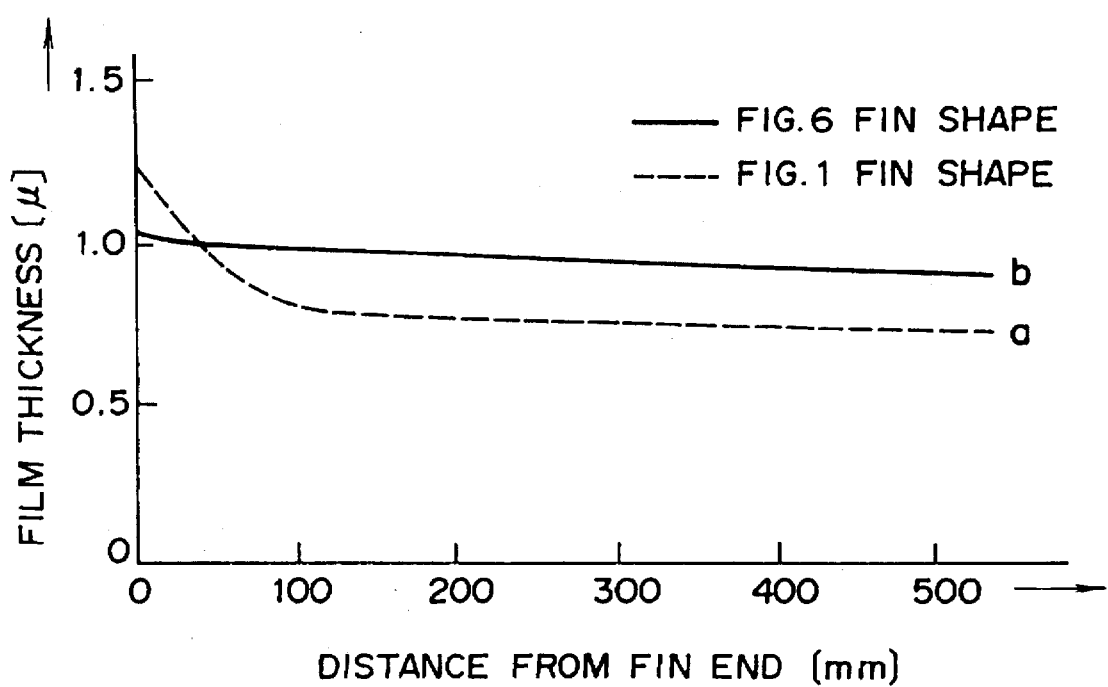
FIG. 7 is a comparative view showing states of formed film thickness when the shape of fins are varied in a plasma processing apparatus according to the present invention.

FIG. 7 shows a case in which under the same film forming conditions a material gas containing Ge is applied to the plasma processing apparatus of the first embodiment and to that of the present embodiment, for film forming. In FIG. 7, the film thickness distribution of a semiconductor film-formed using the plasma processing apparatus of the first embodiment is designated by a character "a", while that using the plasma processing apparatus of the second embodiment is designated by a character "b".

From FIG. 7, it can be understood that the semiconductor according to the second embodiment can provide more uniform film thickness than that in the first embodiment. In addition, the film quality of the semiconductor also was better. The reason would be that approximately 90% of the microwave energy is used to form the plasma for forming an accumulated film on the substrate surface while the remaining 10% of the microwave which was not used to form the plasma would sometimes undesirably etch the accumulated film, which causes the film quality of the accumulated film to be lowered with unevenness.

Third Embodiment

Figure 8:
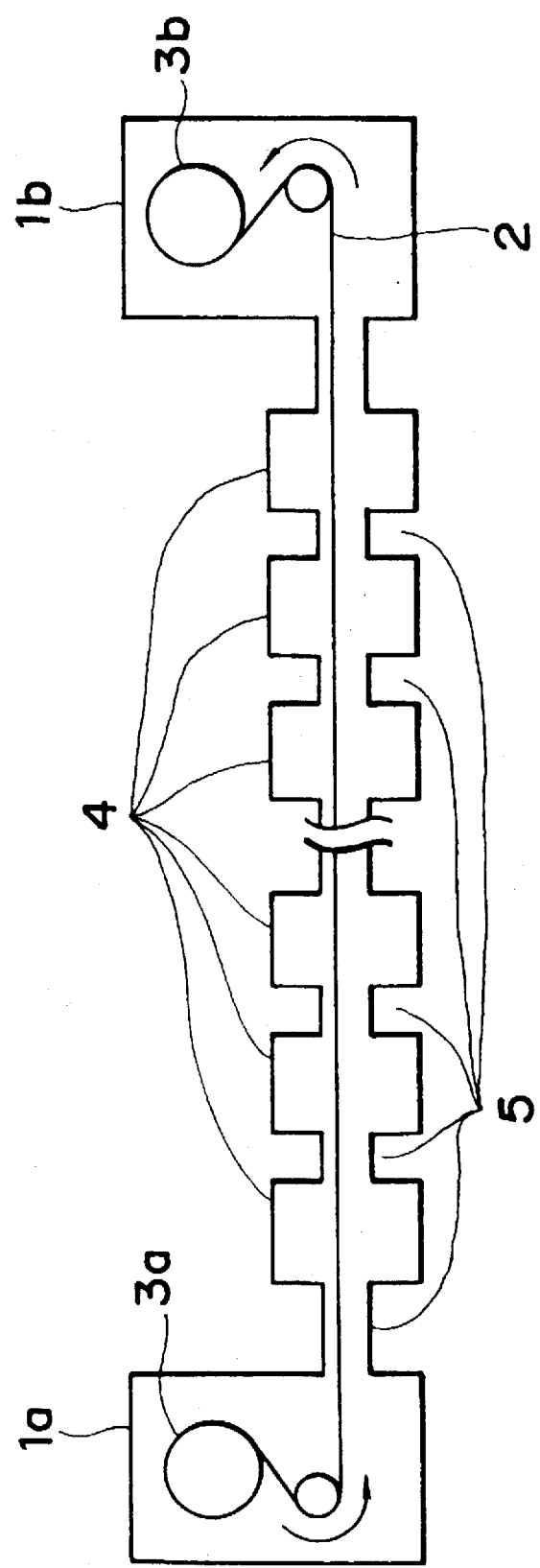
FIG. 8 is a continuous plasma processing apparatus using the present invention.

As an alternative embodiment of the present invention, a Roll to Roll-type semiconductor film forming apparatus is known. In this apparatus, as shown in FIG. 8, a belt-like substrate 2 is successively conveyed from a vacuum chamber 1a containing a bobbin 3a around which the substrate 2 is wound, and after passing through a plasma processing chamber 4 coupled to a gas gate 5, received around a bobbin 3b contained in a vacuum chamber 1b.

Figure 9B:
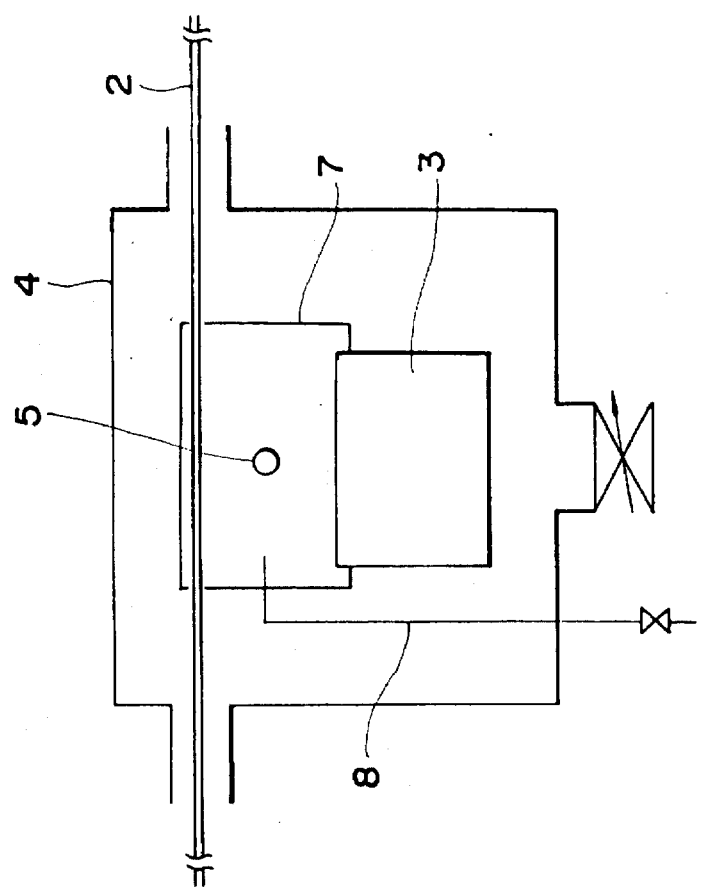
FIGS. 9A and 9B are schematic cross-sectional views with an enlarged plasma processing chamber 4 in FIG. 8.
Figure 9A:
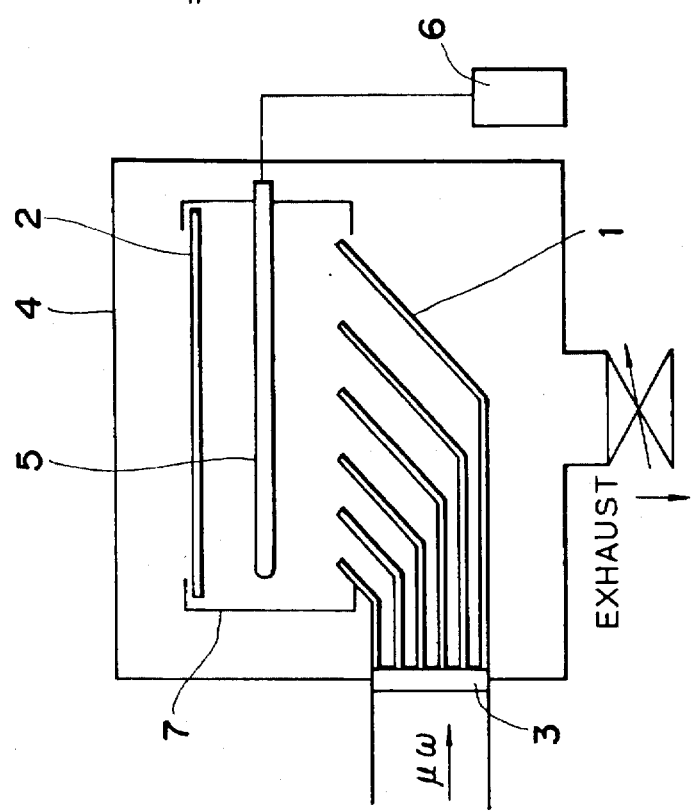

FIG. 9 shows the plasma processing chamber with an enlarged size. Through FIGS. 9A–9B, the same numerals or characters designate the same components. In FIG. 9, a microwave is emitted on a continuously moving belt-like substrate 2 through the microwave introductory window 3 coupled to the microwave generating device (not shown) and the fins 1 to form a plasma and an accumulated film. In FIG. 9, the numeral 5 designates a bias bar receives a high-frequency applied by a high-frequency power source 6. By increasing the colliding speed of the atoms against the belt-like substrate 2, a film having a higher density could be provided.

With the above composition, it is possible to produce a film of semiconductor used for a solar battery for example which has a uniform thickness, over a long time continuously while effectively preventing the adhesion of the film to the microwave introductory window and the window destruction.

What is claimed is:

1. A microwave plasma processing apparatus comprising:
    a vacuum processing chamber which can contain a substrate having at least a surface to be processed;
    a microwave introducing aperture for introducing a microwave into said vacuum processing chamber; and
    at least two fins each fin having two ends one end of each fin being arranged adjacent to said microwave introducing aperture at an inner side of said vacuum processing chamber, said fins being arranged in a row which extends from the microwave introducing aperture in a direction parallel to the propagation of the microwave with a space between each fin to divide the microwaves introduced through said microwave introducing aperture;
    wherein the lengths of the fins measured from the ends adjacent to the microwave introducing aperture to the ends furthest from the microwave introducing aperture, are different, and a plane defined at least by the ends of two fins furthest from said microwave introducing aperture is not perpendicular and not parallel to a plane of said microwave introducing aperture.

2. A microwave plasma processing apparatus according to claim 1, wherein there are at least three fin members, and the difference between the lengths of said fins are different per adjacent fins respectively.

3. An apparatus according to claim 2, wherein a distance between adjacent fins, said distance being measured between the ends of the fins furthest from the microwave introducing aperture, is a minimum (P min) for the two fins whose ends are positioned closest to the microwave introducing aperture.

4. An apparatus according to claim 2, wherein a distance between adjacent fins, said distance being measured between the ends of the fins furthest from the microwave introducing aperture, is a maximum (P max) for the two fins whose ends are positioned furthest from the microwave introducing aperture.

5. An apparatus according to claim 2, wherein a distance between adjacent fins, said distance being measured between the ends of the fins furthest from the microwave introducing aperture is a maximum (P max) for the two fins whose ends are positioned furthest from the microwave introducing aperture and is a minimum (P min) for the two fins whose ends are positioned closest to the microwave introducing aperture.

6. A microwave plasma processing apparatus according to claim 1, further comprising conveying means for continuously moving said substrate.

7. An apparatus according to claim 1 further comprising;
    a bias bar disposed at an inner side of said vacuum chamber furthest from said microwave introducing aperture, said bias bar being longer than a distance between the fin ends of the two longest fins.

8. An apparatus according to claim 1, wherein the spaces between said fins are different.

9. An apparatus according to claim 8, wherein the space is smaller at one end side.

10. An apparatus according to claim 8, wherein the space is larger at one end side.

11. An apparatus according to claim 8, wherein the space is smaller at one end of the fin and is larger at the other end of the fin.

12. An apparatus according to claim 1, wherein said fin is bent.

13. An apparatus according to claim 1, wherein said adjacent fins are arranged in parallel to each other.

14. An apparatus according to claim 1, wherein said fin is shaped in a louver.

15. A microwave plasma processing method comprising:
    disposing a substrate within a vacuum processing chamber which can be evacuated;
    supplying microwave through a microwave introducing aperture into said vacuum processing chamber, wherein the microwave introduced is divided by a member having at least two fins, said fins being arranged in a row which extends from the microwave introducing window in a direction parallel to the propagation of the microwave, each fin having two ends, and said microwave irradiates said substrate, wherein the fins have different lengths measured from the ends adjacent to the microwave introducing aperture to the ends furthest from said microwave introducing aperture, and the end side of said fin furthest from said microwave introducing aperture is not perpendicular to and not parallel to said microwave introducing aperture, thereby producing a plasma within said vacuum processing chamber at an end side of said fin opposite to said microwave introducing aperture.

16. A method according to claim 15, wherein the difference between the lengths of said fins, measured from the ends adjacent to the microwave introducing aperture to the ends furthest from said microwave introducing aperture, are different per adjacent fins respectively.

17. A method according to claim 15, wherein said substrate is band-shaped and continuously moving.

18. A method to claim 15, further comprising supplying a high frequency signal from a bias bar provided between the fin closest to said substrate and said substrate.

* * * * *

UNITED STATES PATENT AND TRADEMARK OFFICE
CERTIFICATE OF CORRECTION

PATENT NO. : 5,700,326

DATED : December 23, 1997

INVENTOR(S) : KAZUMASA TAKATSU ET AL.  Page 1 of 2

It is certified that error appears in the above-identified patent and that said Letters Patent is hereby corrected as shown below:

SHEET 4

Figure 4, "FOINT" should read --POINT--.

COLUMN 1

Line 21, "a" should be deleted.
    Line 24, "pouring to" should be deleted.

COLUMN 2

Line 49, "world" should read --would--.

COLUMN 3

Line 2, "comprising" should read --comprises--.
    Line 15, "a" should be deleted.
    Line 37, "when" should read --with--.

COLUMN 4

Line 10, "above-" should read --the above--.
    Line 18, "(coning" should read --(Corning--.
    Line 30, "problem" should read --a problem--.
    Line 35, "the all" should read --all the--.

UNITED STATES PATENT AND TRADEMARK OFFICE
CERTIFICATE OF CORRECTION

PATENT NO. : 5,700,326

DATED : December 23, 1997

INVENTOR(S): KAZUMASA TAKATSU ET AL.  Page 2 of 2

It is certified that error appears in the above-identified patent and that said Letters Patent is hereby corrected as shown below:

<u>COLUMN 5</u>

Line 8, after "end" insert --would be greater than that of Si. As a result--; and "so as to vary" should be deleted.
    Line 9, after "distribution" insert --varies--.
    Line 48, "designates" should read --designating--.
    Line 66, "ends one" should read --ends, one--.

<u>COLUMN 6</u>

Line 41, "comprising;" should read --comprising:--.

Signed and Sealed this

Fourth Day of August, 1998

Attest:

BRUCE LEHMAN

*Attesting Officer*  *Commissioner of Patents and Trademarks*